(12) United States Patent
Hirata et al.

(10) Patent No.: US 10,619,813 B2
(45) Date of Patent: Apr. 14, 2020

(54) SOLID STATE LIGHT SOURCE DEVICE, AUTOMOTIVE LIGHTING USING SAME, IMAGE DISPLAY DEVICE, AND DRIVE METHOD FOR SOLID STATE LIGHT SOURCE DEVICE

(71) Applicant: MAXELL, LTD., Kyoto (JP)

(72) Inventors: Koji Hirata, Ibaraki (JP); Yuki Nagano, Ibaraki (JP); Shoji Yamamoto, Tokyo (JP); Yoshiho Seo, Tokyo (JP)

(73) Assignee: MAXELL, LTD., Kyoto (JP)

( * ) Notice: Subject to any disclaimer, the term of this patent is extended or adjusted under 35 U.S.C. 154(b) by 0 days.

(21) Appl. No.: 16/040,070

(22) Filed: Jul. 19, 2018

(65) Prior Publication Data
US 2018/0347775 A1    Dec. 6, 2018

Related U.S. Application Data

(63) Continuation of application No. 15/035,311, filed as application No. PCT/JP2013/081073 on Nov. 18, 2013, now Pat. No. 10,054,280.

(51) Int. Cl.
*F21V 1/00*     (2006.01)
*F21S 41/25*    (2018.01)
(Continued)

(52) U.S. Cl.
CPC .............. *F21S 41/25* (2018.01); *F21S 41/143* (2018.01); *F21S 41/147* (2018.01); *F21S 41/16* (2018.01);
(Continued)

(58) Field of Classification Search
CPC ......... F21S 41/14–16; F21S 41/27–275; F21S 41/36–365; F21S 48/115; F21S 48/1154;
(Continued)

(56) References Cited

U.S. PATENT DOCUMENTS 7,828,448 B2    11/2010  Kim et al.
9,109,771 B2 *   8/2015  Takahashi ............... F21S 41/16
(Continued)

FOREIGN PATENT DOCUMENTS

CN    1841183 A    10/2006
CN    1991243 A     7/2007
(Continued)

*Primary Examiner* — Jason M Han
(74) *Attorney, Agent, or Firm* — Volpe and Koenig, P.C.

(57) ABSTRACT

A solid state light source device includes N (an integer of two or more) sets of solid state light source assemblies having a plurality of solid state light source cells arranged in a matrix pattern a multiple lens block including N incidence faces facing the N sets of solid state light source assemblies and causing light emitted from the solid state light source cells to be incident through multiple lens cells of a matrix pattern and one emission face composing the light incident from the N incidence faces and a dichroic filter that is obliquely arranged on the incidence faces inside the multiple lens block and selectively reflects or transmits incident light based on the incident light wavelength. Light distribution characteristics and color temperature of light exiting the emission face of the multiple lens block are controlled by a ratio of power supplied to the solid state light source cells.

4 Claims, 14 Drawing Sheets

(51) Int. Cl.
    *F21S 41/143*     (2018.01)
    *F21S 41/147*     (2018.01)
    *F21S 41/275*     (2018.01)
    *F21S 41/27*     (2018.01)
    *F21S 41/36*     (2018.01)
    *F21S 41/16*     (2018.01)
    *H01L 25/075*     (2006.01)
    *F21S 41/365*     (2018.01)

(52) U.S. Cl.
    CPC .............. *F21S 41/27* (2018.01); *F21S 41/275* (2018.01); *F21S 41/36* (2018.01); *F21S 41/365* (2018.01); *H01L 25/0753* (2013.01); *H01L 2924/0002* (2013.01)

(58) Field of Classification Search
    CPC .... F21S 48/1159; F21S 48/12; F21S 48/1208; F21S 48/1216; F21S 48/1225; F21S 48/1233; F21S 48/125; F21S 48/1283; F21S 48/1291; F21S 48/1388; F21S 48/1394; F21S 48/215; F21S 48/218; F21S 48/22; F21S 48/225; F21S 48/234; F21S 48/238; F21S 48/24; H01L 25/0753

USPC ...... 362/249.02, 311.02, 509–511, 520–522, 362/543–545
See application file for complete search history.

(56) References Cited

U.S. PATENT DOCUMENTS

| | | |
|---|---|---|
| 2011/0187998 A1 | 8/2011 | Kimura et al. |
| 2012/0120647 A1 | 5/2012 | Li |
| 2012/0236561 A1 | 9/2012 | Nakaya |

FOREIGN PATENT DOCUMENTS

| | | |
|---|---|---|
| CN | 101546045 A | 9/2009 |
| CN | 201568808 U | 9/2010 |
| JP | 2005-183327 A | 7/2005 |
| JP | 2008-041555 A | 2/2008 |
| JP | 2008-041557 A | 2/2008 |
| JP | 2011-158502 A | 8/2011 |
| JP | 2011-243366 A | 12/2011 |
| JP | 2012-190754 A | 10/2012 |
| JP | 2013-045740 A | 3/2013 |
| JP | 2013-114980 A | 6/2013 |
| JP | 2013-117705 A | 6/2013 |

* cited by examiner

F I G. 2 0
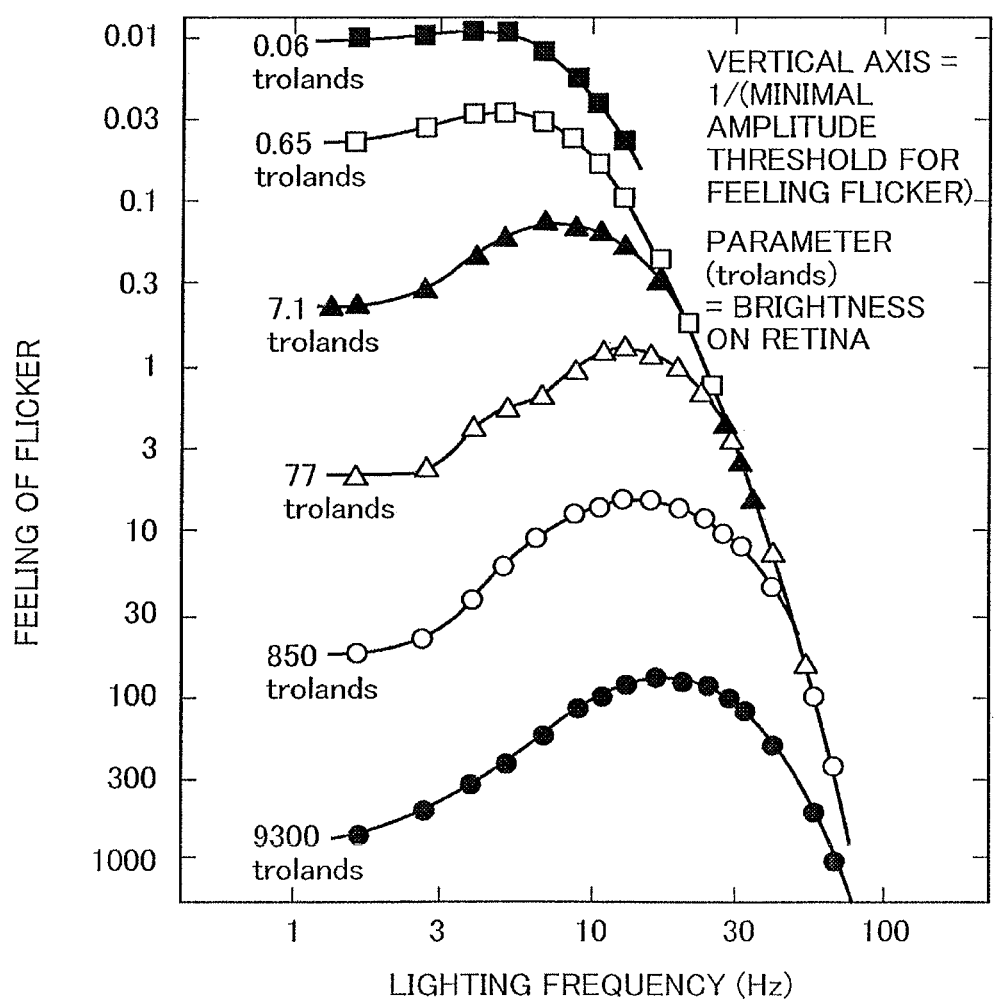

SOLID STATE LIGHT SOURCE DEVICE, AUTOMOTIVE LIGHTING USING SAME, IMAGE DISPLAY DEVICE, AND DRIVE METHOD FOR SOLID STATE LIGHT SOURCE DEVICE

TECHNICAL FIELD

The present invention relates to a solid state light source device such as a light emitting diode (LED), an automotive lighting using the solid state light source device, an image display device, and a drive method for a solid state light source device.

BACKGROUND ART

In recent years, for a light source of an image display device that is one of an optical application device and a head lamp of a vehicle, an LED light source and a laser light source having superior power consumption efficiency and a long product life are used. Particularly, the LED light source has restrictions of the operating environment (temperature and humidity) less than the laser light source and a stable operation and becomes the mainstream.

An LED having high output as a light source of an image display device, generally, is a surface emission light source and cannot collect light into an image display element that is a light receiving unit with high efficiency based on a conservation law of etendue (Etendue=emission area of light source×divergence angle) in a case where the LED is used for a lighting optical system. For this reason, a light source system having a new configuration has been proposed in which a laser light source having a small area of a light emission portion and superior straightness as a primary light source emits laser to a fluorescent substance for excitation so as to acquire light (see Patent Documents 1 and 2).

On the other hand, in recent automotive lightings, a configuration in which an LED is used as a light source, and light distribution characteristics are controlled using an optical lens formed using plastic and a reflector (reflecting mirror) becomes the mainstream (see Patent Document 3).

CITATION LIST

Patent Document

Patent Document 1: JP 2011-158502 A
Patent Document 2: JP 2013-114980 A
Patent Document 3: JP 2008-41557 A

SUMMARY OF THE INVENTION

Problems to be Solved by the Invention

Each of image display devices described in Patent Documents 1 and 2 includes: an image display element; a lighting optical system that emits light of a light source device to the image display element; and a projection lens that enlarges and projects an optical image. Here, the lighting optical system has been contrived not to cause an increase in the size of a light source device when the light source device that collects luminous fluxes from a plurality of light sources into one luminous flux and then emits the luminous flux to a lighting system disposed on the latter stage is used.

More specifically, in Patent Document 1 (FIG. 1), one or more light sources (laser light sources) 300P and 300S having a polarization degree of 50% or more as light sources used for excitation and one or more polarizers 23 transmitting polarized light of one side and reflecting polarized light of the other side are included, and, by combining two sets of laser light having mutually-different polarization directions, excitation light sources that are compact and have high output are formed, and the laser light is collected into a fluorescent substance with which a transparent base material 190 disposed on a later stage is coated, by using a condensing lens 140. As a result, luminous fluxes emitted from the fluorescent substance can be caused to be incident to a lighting optical system of a later stage more efficiently, in other words, without increasing the etendue described above.

Similarly, in Patent Document 2 (FIG. 1), light source units (laser light sources) 10 and 20 having mutually-different polarization directions as light sources used for excitation and a composition unit 30 transmitting polarized light of one side and reflecting polarized light of the other side are included, and, by combining two sets of laser light having mutually-different polarization directions, excitation light sources that are compact and have high output are formed, and the laser light is collected into a fluorescent substance with which a light emitting device 80 of a later stage is coated, by using a superposition optical system 70.

However, in the technologies disclosed in Patent Documents 1 and 2, since the laser light sources are used as light sources, there are restrictions on the operating environments (temperature and humidity), and there are cases where the operation is not stable. In addition, it is not considered to freely control the light distribution characteristics or the color temperature of emitted light.

Meanwhile, in Patent Document 3 (FIG. 2), a lighting unit formed of plastic that is configured by: a light emitting unit 8 (white LED); a reflector formed by a plurality of reflection surfaces M1, M2, M3, and M4; and a shade face S has been disclosed as an automotive lighting. The light emitting unit 8 illustrated here is a light source having an area, has a large value of the etendue described above, and includes four reflection surfaces. Thus, it is difficult to easily control optimal light distribution characteristics. In addition, the light emitting unit 8 is a white LED and cannot freely control the color temperature of light transmitted from the lighting.

The present invention is in consideration of the problems described above, and an object thereof is to provide a solid state light source having high light emission efficiency and being capable of freely controlling the color temperature. In addition, another object is to provide an automotive lighting capable of easily acquiring desired light distribution characteristics.

Solutions to Problems

In order to solve the problems described above, according to the present invention, there is provided a solid state light source device including: N (here, N is an integer of two or more) sets of solid state light source assemblies in which a plurality of solid state light source cells are arranged in a matrix pattern; a multiple lens block that includes N incidence faces facing the N sets of solid state light source assemblies and causing light emitted from the solid state light source cells to be incident through multiple lens cells of a matrix pattern and one emission face composing the light incident from the N incidence faces and causing composed light to exit through multiple lens cells of a matrix pattern; and a dichroic filter that is obliquely arranged on the incidence faces inside the multiple lens block and selectively reflects or transmits incident light based on a wavelength of the incident light, wherein light distribution characteristics and a color temperature of light exiting from the emission face of the multiple lens block to a light receiving unit are configured to be controlled by controlling a ratio of power supplied to the solid state light source cells.

In addition, according to the present invention, there is provided an automotive lighting using a solid state light source device including: a reflector that reflects light exiting from the solid state light source device, wherein the solid state light source device is configured to include a solid state light source assembly in which a plurality of solid state light source cells that are light emitting points are arranged in a matrix pattern, the solid state light source cells are configured to be formed by combining solid state light source cells having light emission colors including light's three primary colors, and light exiting from a plurality of the solid state light source cells is configured to be incident to different positions in the reflector.

Furthermore, according to the present invention, there is provided an image display device using a solid state light source device including: an image display element that forms image light by emitting light exiting from the solid state light source device; and a projection lens that projects the image light formed by the image display element in an enlarged scale, wherein the solid state light source device is configured to include a solid state light source assembly in which a plurality of solid state light source cells that are light emitting points are arranged in a matrix pattern, and the solid state light source cells are configured to be formed by combining solid state light source cells having light emission colors including light's three primary colors.

In addition, according to the present invention, there is provided a drive method for a solid state light source device using solid state light sources as light emitting bodies, wherein it is configured such that illumination acquired in a desired light receiving unit by using light emitted from the solid state light source device is 170 lux or more, a drive current of the solid state light sources has a pulse waveform, and a frequency of the pulse is 60 Hz or more.

Effects of the Invention

According to the present invention, a solid state light source having high light emission efficiency and being capable of freely controlling the color temperature can be provided. In addition, an automotive lighting capable of easily acquiring desired light distribution characteristics can be provided. Furthermore, driving of a solid state light source enabling a user not to feel flicker with a drive current suppressed but to have a visually bright feeling can be performed.

BRIEF DESCRIPTION OF THE DRAWINGS

FIG. 20 is a diagram that illustrates a relation between a lighting frequency and a feeling of flicker felt by a human.

MODE FOR CARRYING OUT THE INVENTION

Hereinafter, embodiments of the present invention will be described with reference to the drawings.

First Embodiment

Figure 1:
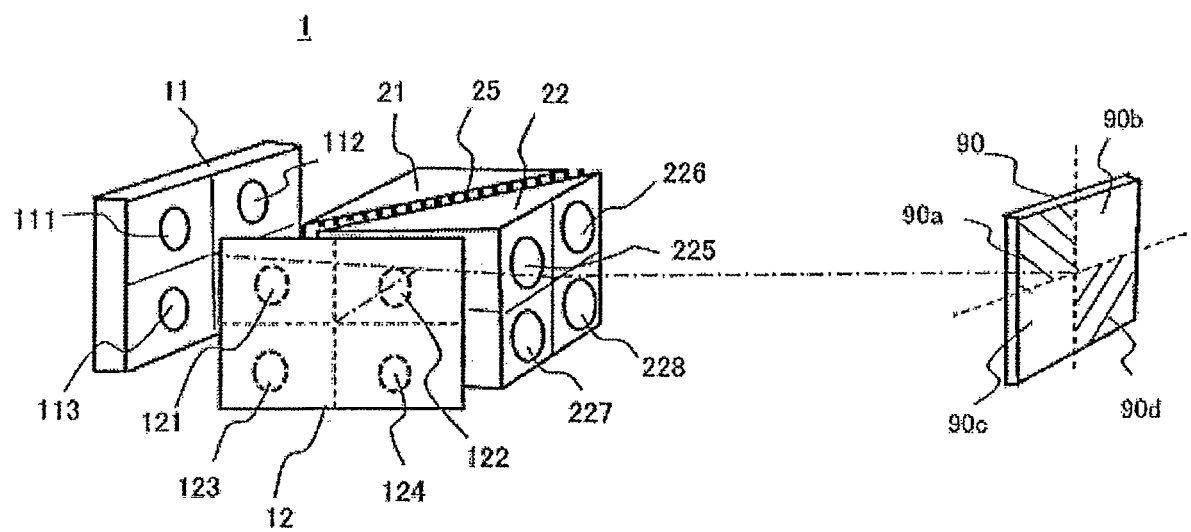
FIG. 1 is a perspective view that illustrates a solid state light source device according to a first embodiment.
Figure 2:
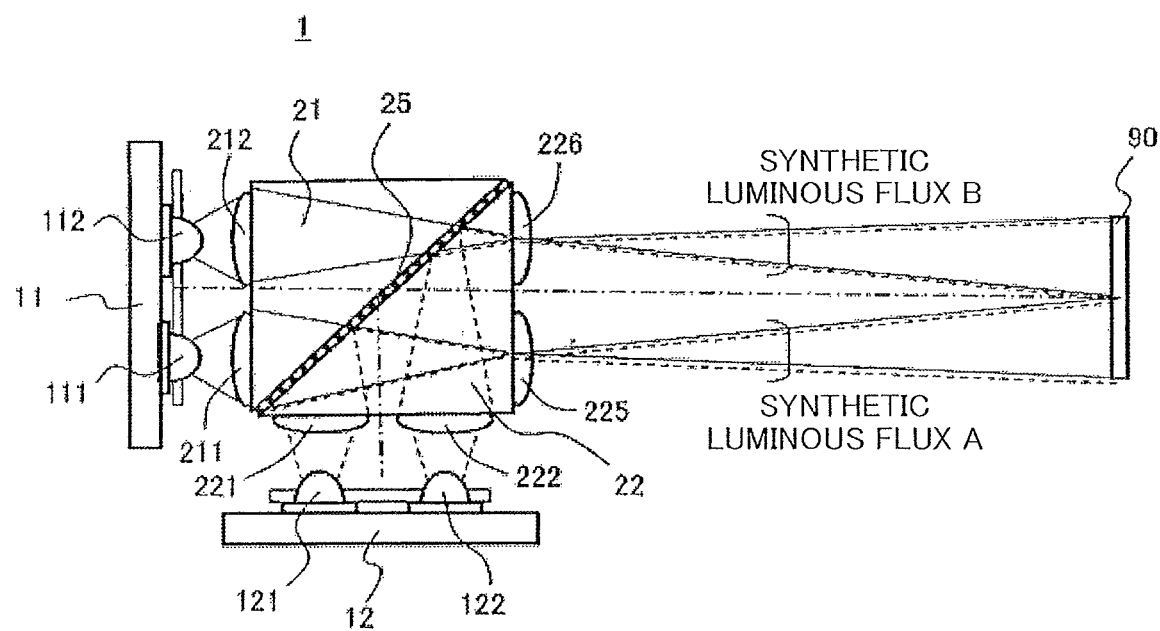
FIG. 2 is a plan view that illustrates a solid state light source device according to the first embodiment.

FIGS. 1 and 2 are diagrams that illustrate the configuration of a solid state light source device according to a first embodiment of the present invention, FIG. 1 is a perspective view, and FIG. 2 is a plan view. Hereinafter, a same reference numeral is assigned to components that similarly function.

The solid state light source device 1 includes: a solid state light source assembly 11 in which a plurality of solid state light source cells corresponding to green are arranged; a solid state light source assembly 12 in which a plurality of solid state light source cells corresponding to blue and red are arranged; and two multiple lens blocks 21 and 22 in which a plurality of multiple lens cells are arranged in a matrix pattern. The multiple lens blocks 21 and 22 have a cross-section of a rectangular equilateral triangular shape, and the hypotenuses thereof are joined together through a dichroic filter 25. The solid state light source assembly 11 and the solid state light source assembly 12 are arranged to face two side faces of the multiple lens blocks 21 and 22.

In the solid state light source assembly 11, a plurality of (here, four) solid state light source cells 111, 112, 113, and 114 are arranged in a matrix pattern (2×2), and each of the solid state light source cells is configured by an LED that emits green light (the solid state light source cell 114 is not illustrated in the drawing). In order to decrease the etendue, the area of the light emitting portion of each solid state light source cell is configured to be 0.5 mm² or less. More preferably, by configuring the area of the light emitting portion to be 0.1 mm² or less, the lighting efficiency can be further increased. In order to collect luminous fluxes emitted from the light emitting portion in a desired direction, an optical device (represented as a convex lens in FIG. 2) used for collecting light is arranged near the solid state light source.

On the other hand, in the solid state light source assembly 12, a plurality of (here, four) solid state light source cells 121, 122, 123, and 124 are arranged in a matrix pattern (2×2), the solid state light source cells 121 and 124 are configured by LEDs emitting blue light, and the solid state light source cells 122 and 123 are configured by LEDs emitting red light. Also for these, in order to decrease the etendue, the area of the light emitting portion of each solid state light source cell is configured to be 0.5 mm² or less (more preferably, 0.1 mm² or less).

The multiple lens block 21 faces the solid state light source assembly 11, and multiple lens cells 211 to 214 are arranged in a matrix pattern at positions facing the solid state light source cells 111 to 114 (the multiple lens cells 213 and 214 are not illustrated). The multiple lens block 22 faces the solid state light source assembly 12, and multiple lens cells 221 to 224 are arranged in a matrix pattern at positions facing the solid state light source cells 121 to 124 (the multiple lens cells 223 and 224 are not illustrated). On an emission face of the multiple lens block 22, multiple lens cells 225 to 228 are further arranged in a matrix pattern.

The dichroic filter 25 selectively reflects or transmits incident light based on the wavelength of the incident light. Here, light of a green wavelength region is transmitted, and light of a red wavelength region and light of a blue wavelength region are reflected. This dichroic filter 25 may be disposed in each of the multiple lens blocks 21 and 22 or may be disposed alone in one of the multiple lens blocks. In any of the cases, the dichroic filter is interposed between two multiple lens blocks and is obliquely arranged on the incidence face (side face). While the two multiple lens blocks 21 and 22 are configured to have a bonding structure having advantages of improved assembly precision, a decreased reflection surface, and the like, the multiple lens blocks may be separate from each other.

Green luminous fluxes emitted from the solid state light source cells 111 to 114 of the solid state light source assembly 11 are incident from the multiple lens cells 212 to 214 of the multiple lens block 21, are transmitted through the dichroic filter 25, and exit from the multiple lens cells 225 to 228 of the multiple lens block 22.

Red/blue luminous fluxes emitted from the solid state light source cells 121 to 124 of the solid state light source assembly 12 are incident from the multiple lens cells 222 to 224 of the multiple lens block 22, are reflected by the dichroic filter 25, and exit from the multiple lens cells 225 to 228.

The luminous fluxes exiting from the multiple lens cells 225 to 228 of the multiple lens block 22 are emitted to a light receiving unit 90 in an enlarged scale. The multiple lens cells 225 to 228 are formed to have such an aspect ratio so as to form a desired rectangular shape in the light receiving unit 90. The luminous fluxes emitted from the solid state light source assembly 11 and the solid state light source assembly 12 are composed by the dichroic filter 25. For example, the luminous fluxes emitted from the solid state light source cell 111 are composed with the luminous fluxes emitted from the solid state light source cell 121 to be composite luminous fluxes A and are emitted to an area 90a of the light receiving unit 90. The luminous fluxes emitted from the solid state light source cell 112 is composed with the luminous fluxes emitted from the solid state light source cell 122 to be composite luminous fluxes B and are emitted to an area 90b of the light receiving unit 90. Similarly, composite luminous fluxes C and D (not illustrated in the drawing) are respectively emitted to areas 90c and 90d of the light receiving unit 90.

In the light receiving unit 90, enlarged images are individually acquired in the areas 90a to 90d corresponding to the composite luminous fluxes, and thus, the brightness or the chromaticity can be individually changed within the same light receiving unit 90. For example, by superimposing the green light emitted by the solid state light source assembly 11 and the blue/red light emitted by the solid state light source assembly 12 onto the light receiving unit 90 at a predetermined color mixing ratio, white light can be acquired in each area. In addition, also by changing the color mixing ratio, various colors (color temperatures) appearing within a coordinate range represented as three colors alone on a chromaticity diagram can be represented.

According to this embodiment, by configuring the emission face of the solid state light source to be 0.5 mm² or less, the etendue can be decreased, and the light emission efficiency can be improved. Furthermore, by changing the mixing ratio of combined light of LED (solid state) light sources having a plurality of light emission colors, the color temperature of the emitted luminous fluxes can be freely controlled.

In addition, in this embodiment, while the solid state light source assembly 12 is configured by combining solid light source cells emitting blue light and solid state light source cells emitting red light, all the solid state light source cells may be solid state light source cells having magenta as the light emission color.

Second Embodiment

Figure 3:
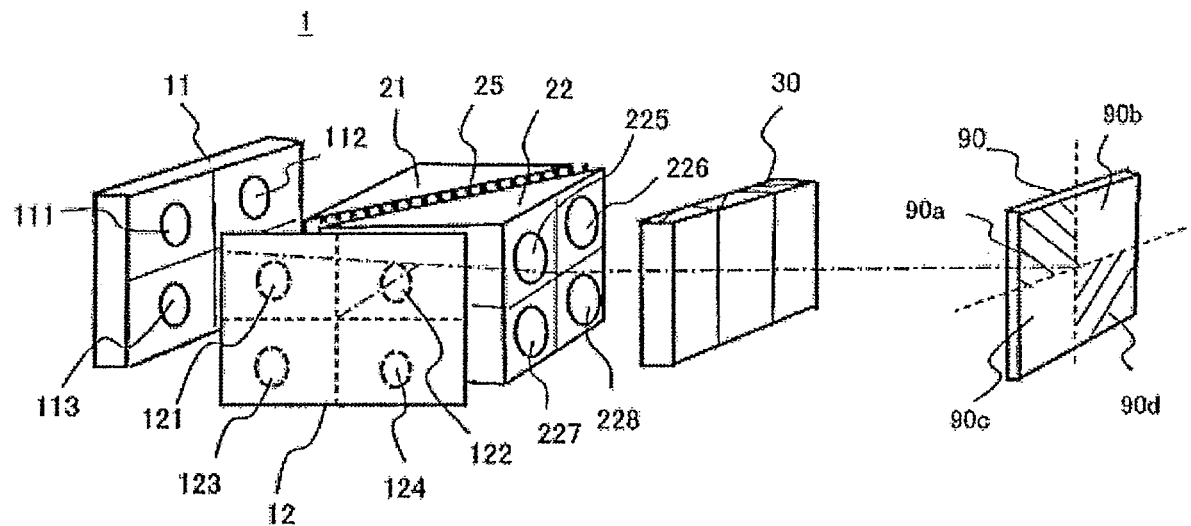
FIG. 3 is a perspective view that illustrates a solid state light source device according to a second embodiment.
Figure 4:
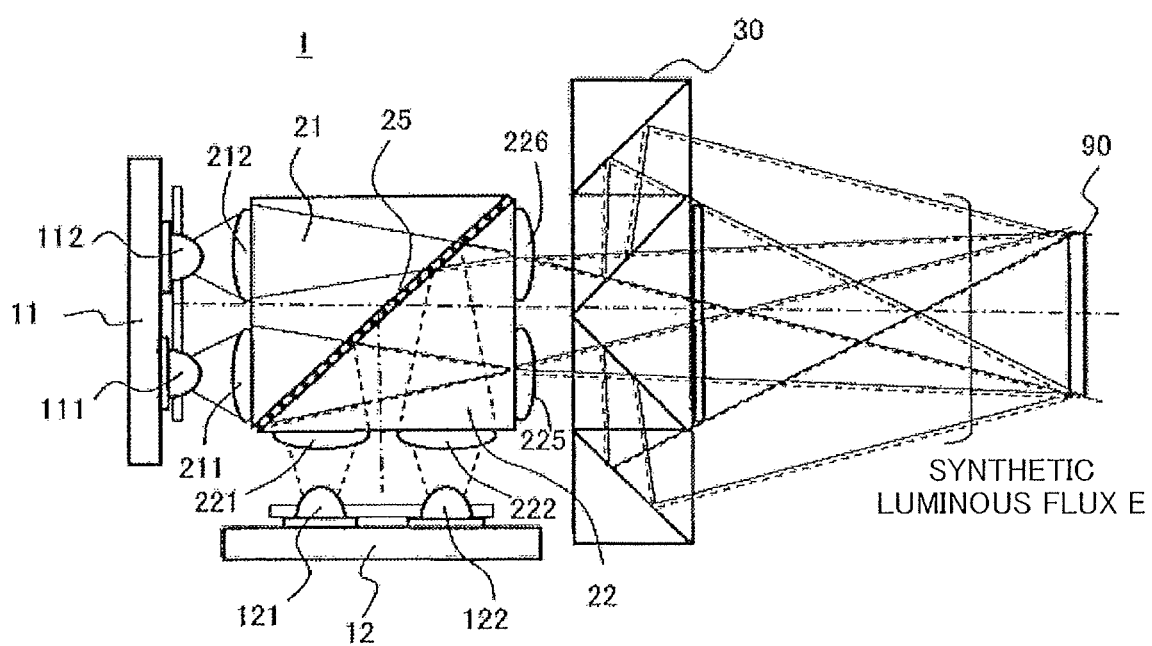
FIG. 4 is a plan view that illustrates a solid state light source device according to the second embodiment.

FIGS. 3 and 4 are diagrams that illustrate the configuration of a solid state light source device according to a second embodiment of the present invention, FIG. 3 is a perspective view, and FIG. 4 is a plan view. Differences from the first embodiment described above are in that a polarization conversion element 30 is disposed between a multiple lens block 22 and a light receiving unit 90, and luminous fluxes are configured to be superimposed in the light receiving unit 90 after the polarization directions of light exiting from the multiple lens block 22 are aligned.

For example, green luminous fluxes emitted from a solid state light source cell 111 of a solid state light source assembly 11 are collected by a multiple lens cell 211 of a multiple lens block 21 that is oppositely arranged and are enlarged and exit from a multiple lens cell 225 disposed in a corresponding multiple lens block 22. The luminous fluxes that are enlarged and exit from the multiple lens 225 are incident to the polarization conversion element 30 and are projected to the light receiving unit 90 in an enlarged scale as light of which the polarization direction is aligned.

Figure 16:
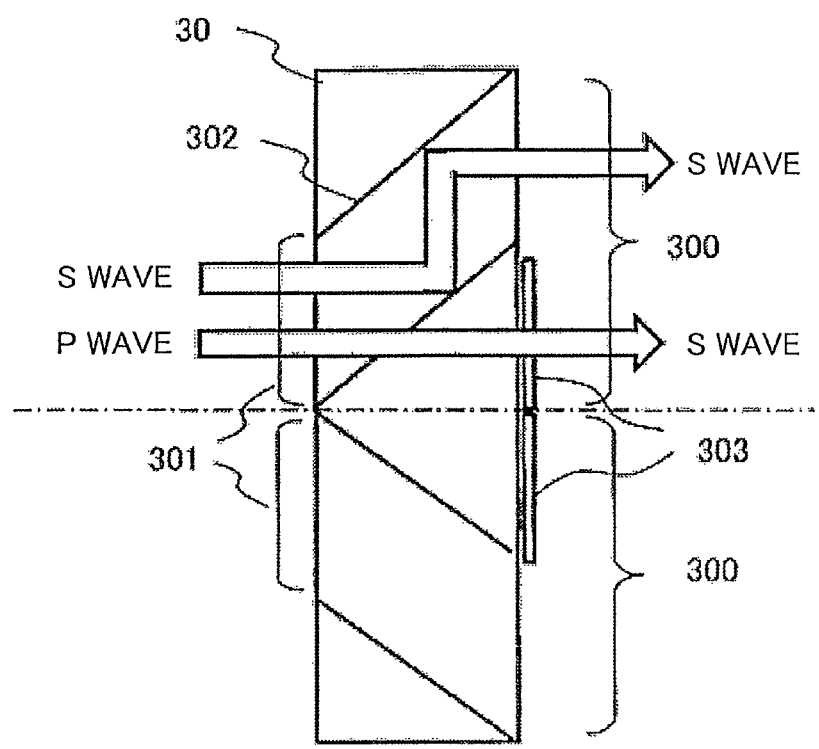
FIG. 16 is a diagram that illustrates the configuration of a polarization conversion element.

FIG. 16 is a diagram that illustrates the configuration of the polarization conversion element 30. The polarization conversion element 30 aligns the polarization states of luminous fluxes A to D exiting from multiple lens cells 225 to 228 and has a configuration in which a plurality of polarization conversion cells 300 are arranged in parallel with one-to-one matching with the multiple lens cells 225 to 228. The luminous fluxes (a two-dimensional light source image of the solid state light source) exiting from the multiple lens cells 225 to 228 are incident to an incidence area 301 of a corresponding polarization conversion cell 300.

In each polarization conversion cell 300, a polarized beam splitter film 302 (hereinafter, referred to as a PBS film) as a polarization splitter film and a phase difference plate 303 are included. The PBS film 302 splits luminous fluxes (a P wave and an S wave are mixed), which are non-polarized state, incident to the incidence area 301 by transmitting the P wave and reflecting the S wave. The P wave is transmitted through the PBS film 302 and has the polarization direction converted into an S wave by the phase difference plate 303 and exit. On the other hand, the S wave is reflected by the PBS film 302 and is reflected again by a neighboring PBS film 302 arranged to be approximately parallel and exit with maintained as an S wave. As a result, luminous fluxes having the polarization direction aligned in the S wave can be acquired.

Figure 17:
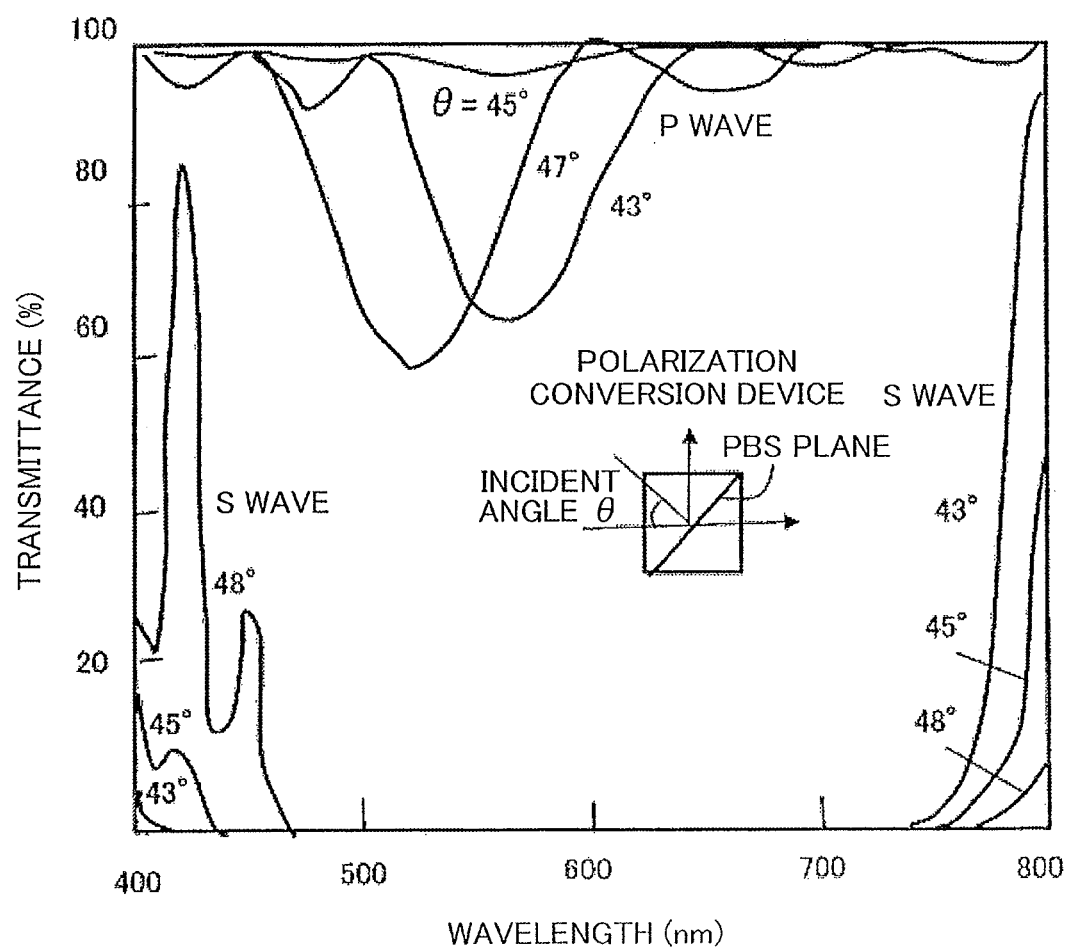
FIG. 17 is a diagram that illustrates the transmittance of a P wave and the transmittance of an S wave on a PBS surface of a polarization conversion element.

FIG. 17 is a diagram that illustrates the transmittance of a P wave and the transmittance of an S wave on a PBS plane of a general polarization conversion element. The transmittance (or the reflectivity) of the P wave and the S wave depends on the incidence angle and the wavelength. The transmittance of a P wave of the green wavelength region markedly decreases as the incidence angle deviates from an incidence angle of 45 degrees by ±2 degrees. Meanwhile, similarly, the transmittance of an S wave of the blue wavelength region markedly decreases as the incidence angle deviates from an incidence angle of 45 degrees by ±2 degrees. For this reason, in this embodiment, a telecentric optical system is used such that the beam incidence angle on a reflection surface on which the PBS film 302 is disposed is in a desired range.

In the second embodiment, luminous fluxes exiting from one multiple lens cell have optical paths split into a P wave and an S wave by the polarization conversion element 30. Accordingly, in the light receiving unit 90, all the luminous fluxes enlarged by the multiple lens cell are superimposed (represented as a composite luminous flux E), and illumination light having uniform brightness for the whole face of the light receiving unit 90 can be acquired.

At that time, by combining a plurality of multiple lens blocks in which multiple lens cells having a plurality of lens functions in correspondence with the solid state light source cells are arranged in a matrix pattern, the polarization directions can be aligned to a constant direction without decreasing the beam passing ratio of the polarization conversion element 30.

In addition, also in the second embodiment, by superimposing light emitted by the solid state light source assembly 11 emitting green light and light emitted by the solid state light source assembly 12 emitting blue light and red light onto the light receiving unit at a predetermined color mixing ratio, white light can be acquired. In addition, it is apparent that, by changing the color mixing ratio, various colors (color temperatures) appearing within a coordinate range represented as three colors alone on a chromaticity diagram can be represented.

Third Embodiment

Figure 5:
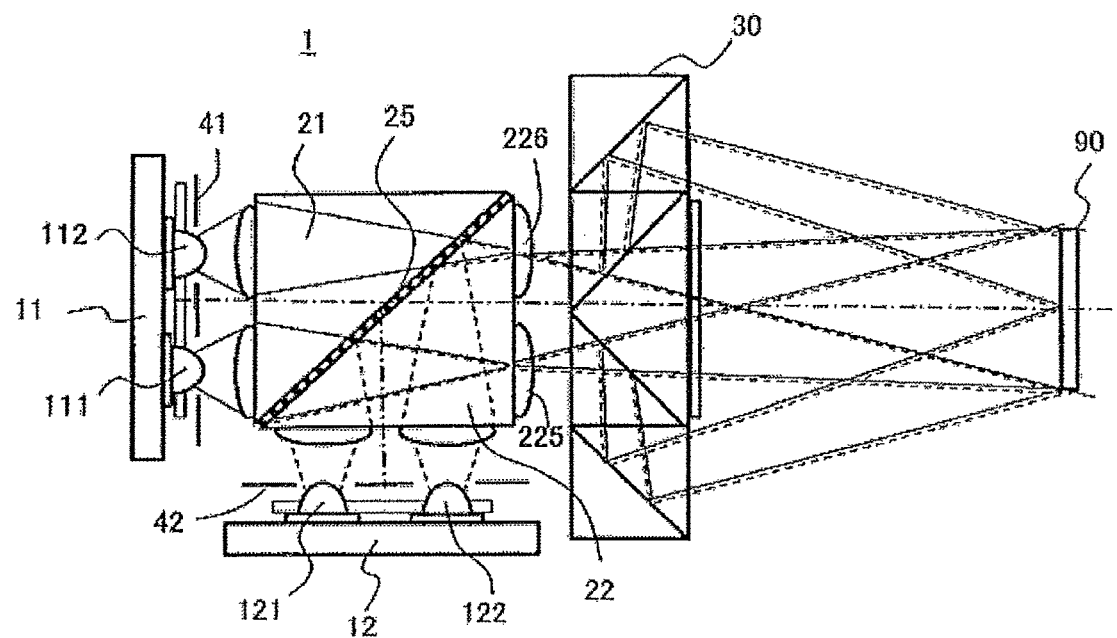
FIG. 5 is a plan view that illustrates a solid state light source device according to a third embodiment.

FIG. 5 is a plan view that illustrates a solid state light source device according to a third embodiment of the present invention. In this embodiment, light shielding plates 41 and 42 are added to the exit side of the solid state light source cell in the configuration according to the second embodiment (FIG. 4) described above. By arranging the light shielding plates 41 and 42, return light (stray light) returning to the solid state light source cell is decreased, and there are effects of securing a life of the solid state light source and reducing the adverse influence of the stray light on the light source light.

Fourth Embodiment

Figure 6:
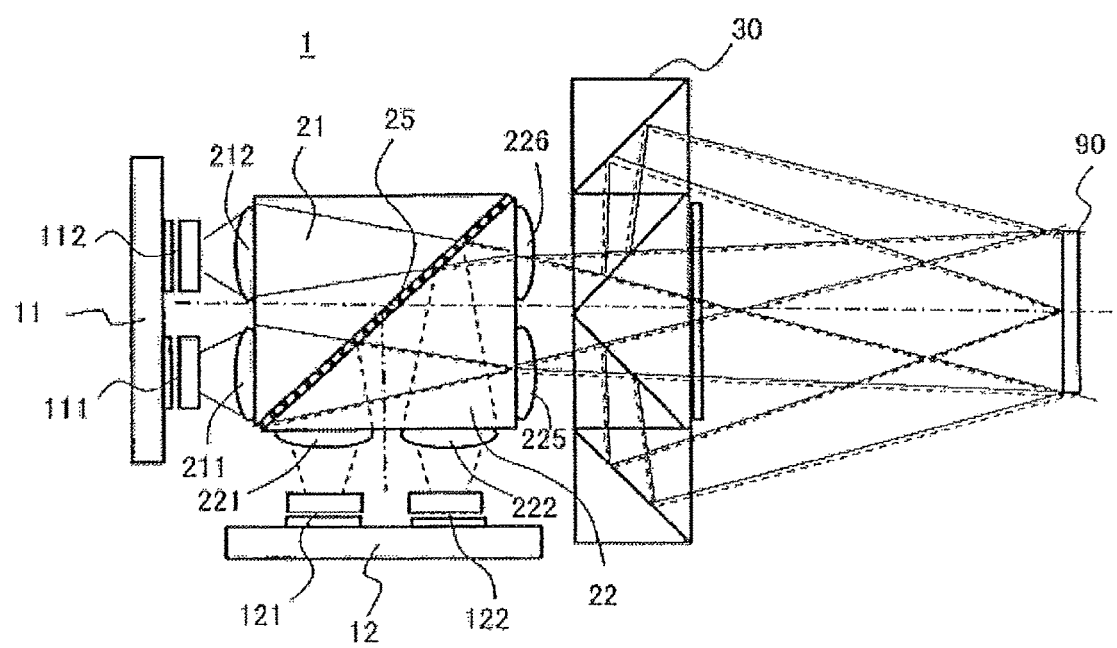
FIG. 6 is a plan view that illustrates a solid state light source device according to a fourth embodiment.

FIG. 6 is a plan view that illustrates a solid state light source device according to a fourth embodiment of the present invention. According to this embodiment, in the configuration according to the second embodiment described above (FIG. 4), in each of the solid state light source cells 111, 112, . . . , not a convex lens but a diffractive lens is arranged as an optical device. The diffractive lens can be optimally designed in a case where the wavelength region of the light source is a narrow band, and the refractive power can be relatively freely controlled by suppressing a diffractive loss. Accordingly, the diffractive lens is appropriate for controlling the directivity of the solid state light source.

Fifth Embodiment

Figure 7:
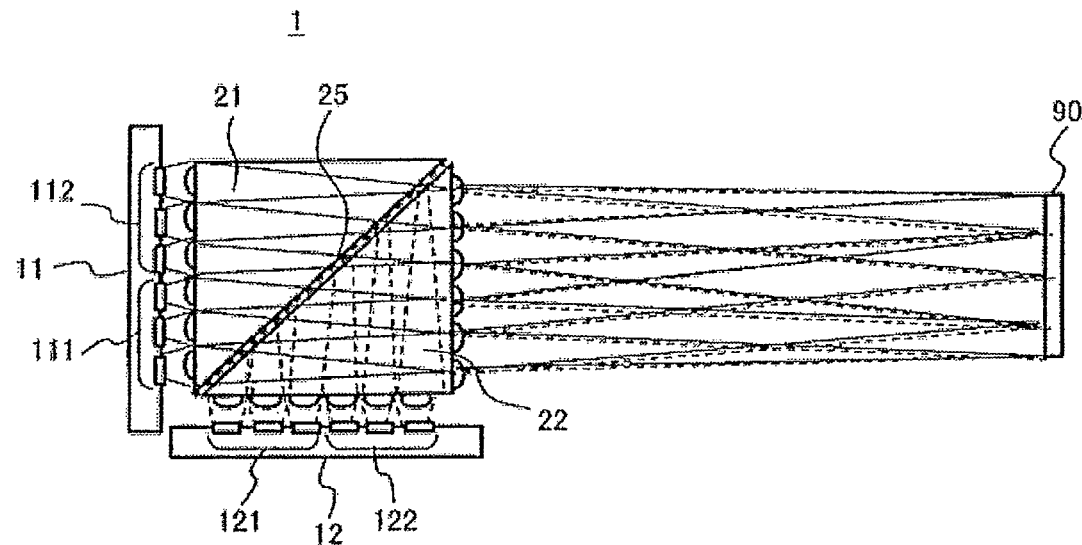
FIG. 7 is a plan view that illustrates a solid state light source device according to a fifth embodiment.

FIG. 7 is a plan view that illustrates a solid state light source device according to a fifth embodiment of the present invention. According to this embodiment, in the configuration of the first embodiment (FIG. 2) described above, each of the solid state light source cells 111, 112, . . . is configured by a plurality of solid state light sources. Each solid state light source cell illustrated in FIG. 7 is configured to include 3×3=9 solid state light sources. According to this, also in the multiple lens blocks 21 and 22, the multiple lens cell is arranged to face each individual light source. As a result, a plurality of composite luminous fluxes corresponding to the number of solid state light sources are emitted to the light receiving unit 90.

Sixth Embodiment

Figure 8:
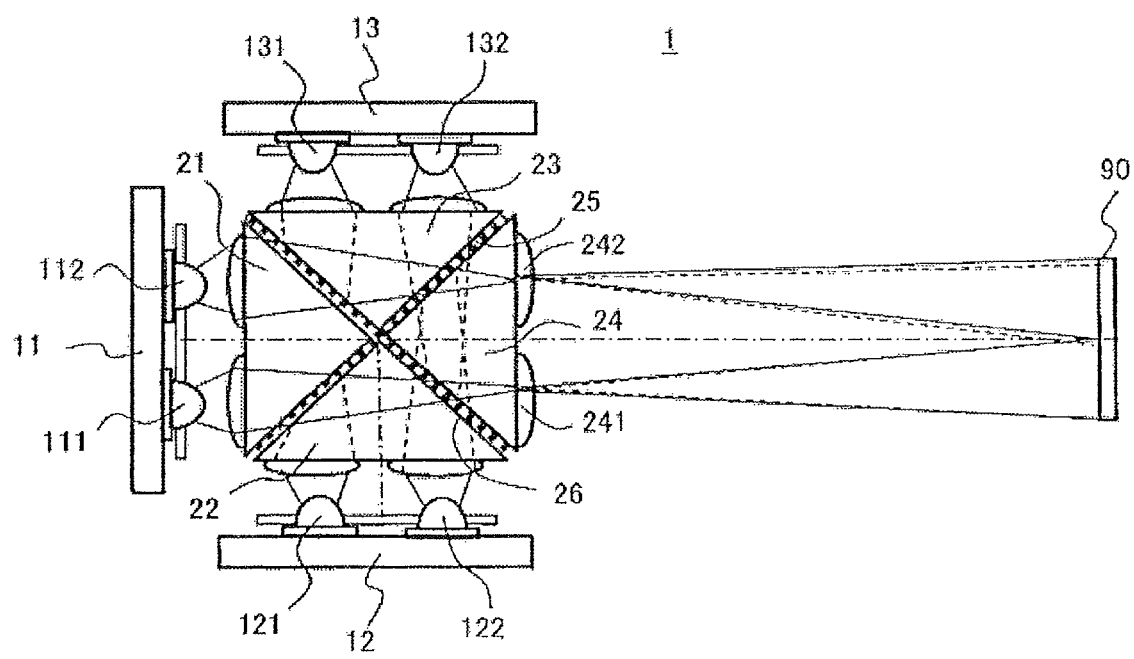
FIG. 8 is a plan view that illustrates a solid state light source device according to a sixth embodiment.

FIG. 8 is a plan view that illustrates a solid state light source device according to a sixth embodiment. According to this embodiment, in the configuration of the first embodiment (FIG. 2), three solid state light source assemblies 11, 12, and 13 are included. The solid state light source assembly 11 is configured by solid state light source cells 111, 112, . . . , emitting green light, the solid state light source assembly 12 is configured by solid state light source cells 121, 122, . . . , emitting red light, and the solid state light source assembly 13 is configured by solid state light source cells 131, 132, . . . , emitting blue light. In addition, three multiple lens blocks 21, 22, and 23 and an exit-side multiple lens block 24 are disposed to face such solid state light source assemblies. Then, on the bonding face of the four multiple lens blocks, two dichroic filters 25 and 26 are arranged. Light of three colors emitted from the solid state light source assemblies 11, 12, and 13 are composed together by the multiple lens blocks 21, 22, 23, and 24 and are emitted to a light receiving unit 90.

At this time, by controlling the emission amounts of the green solid state light source assembly 11, the red solid state light source assembly 12, and the blue solid state light source assembly 13 and superimposing the light onto the light receiving unit 90 at a predetermined color mixing ratio, desired white light can be acquired for each area. In addition, by changing the color mixing ratio, various colors (color temperatures) appearing within a coordinate range represented as three colors alone on a chromaticity diagram can be represented. Furthermore, similar to the first embodiment, in the light receiving unit 90, an enlarged image is individually acquired in each area in correspondence with each composite luminous flux, and accordingly, the brightness and the chromaticity can be individually changed within the same light receiving unit 90.

Seventh Embodiment

Figure 9:
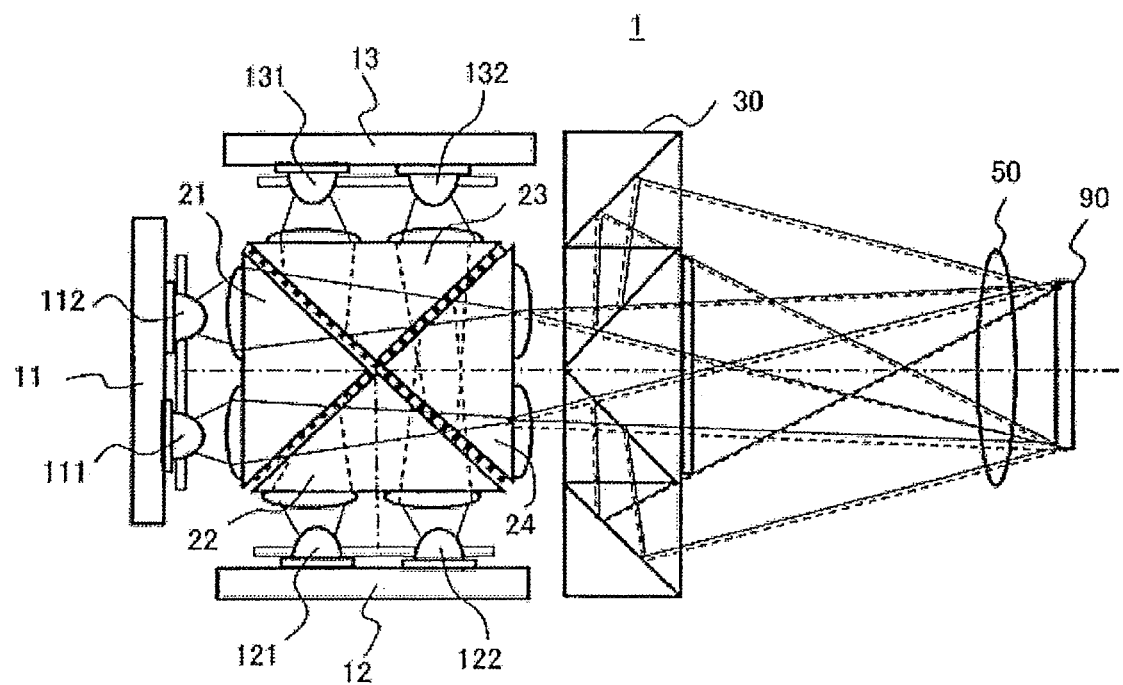
FIG. 9 is a plan view that illustrates a solid state light source device according to a seventh embodiment.

FIG. 9 is a plan view that illustrates a solid state light source device according to a seventh embodiment of the present invention. According to this embodiment, in the configuration of the sixth embodiment (FIG. 8) described above, a superposition lens 50 is arranged between a multiple lens block 24 and a light receiving unit 90. The superposition lens 50 can efficiently superimpose light exiting from the multiple lens block 24 onto the polarization conversion element 30 and the light receiving unit 90. Accordingly, the solid state light source device is appropriate as a light source device of an image display device or the like.

Eighth Embodiment

Figure 10:
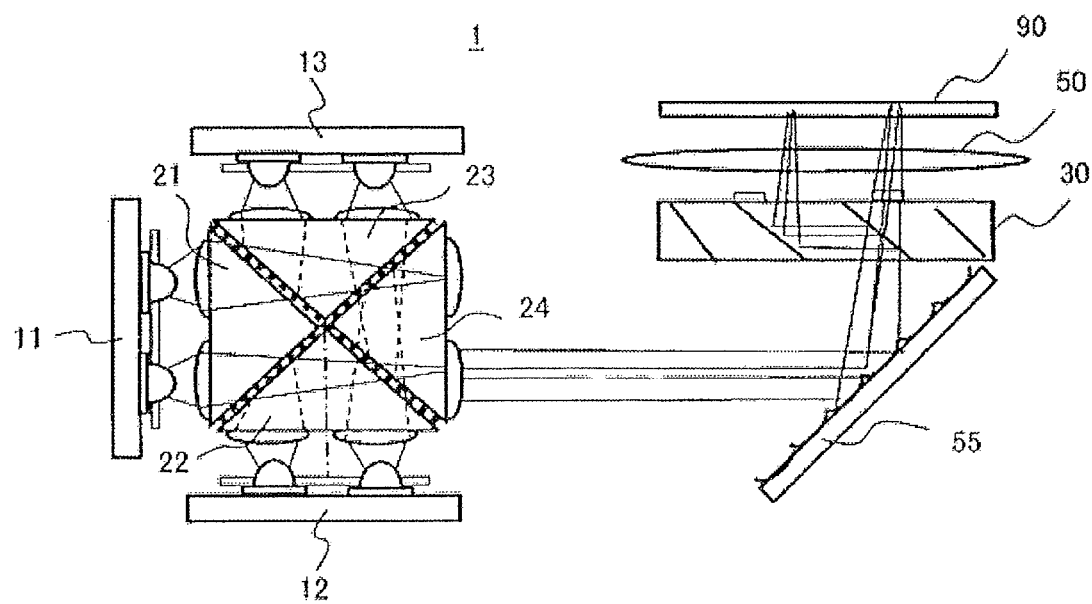
FIG. 10 is a plan view that illustrates a solid state light source device according to an eighth embodiment.

FIG. 10 is a plan view that illustrates a solid state light source device according to an eighth embodiment of the present invention. According to this embodiment, in the configuration of the seventh embodiment (FIG. 9) described above, a luminous flux conversion mirror 55 is arranged between a multiple lens block 24 and a polarization conversion element 30, and an optical path from the polarization conversion element 30 to a light receiving unit 90 is converted into a perpendicular direction.

The luminous flux conversion mirror 55 has a function for collecting luminous fluxes exiting from the multiple lens block 24. For this reason, the shape of the surface of the luminous flux conversion mirror 55 has a cross-section, which has a cylindrical axis in the long axis direction (a depth direction of the drawing) of the polarization conversion element 30, having a concave face (cylindrical face) shape. As a result, since the beam passing ratio of the polarization conversion element 30 is improved, a light source device having high light utilization efficiency can be acquired.

In addition, by using the superposition lens 50 arranged between the polarization conversion element 30 and the light receiving unit 90, the beam incidence angle for the light receiving unit 90 is controlled. Particularly, in a case where a transmission-type image display element (liquid crystal device) is used as the light receiving unit 90, the beam incidence angle can be decreased also in the vicinity of the display screen, and accordingly, a bright image having superior contrast performance can be acquired.

The solid state light source devices according to the first to eighth embodiments described above can be applied to an automotive lighting (headlight) or a light source of an image display device to be described below.

Ninth Embodiment

Figure 11:
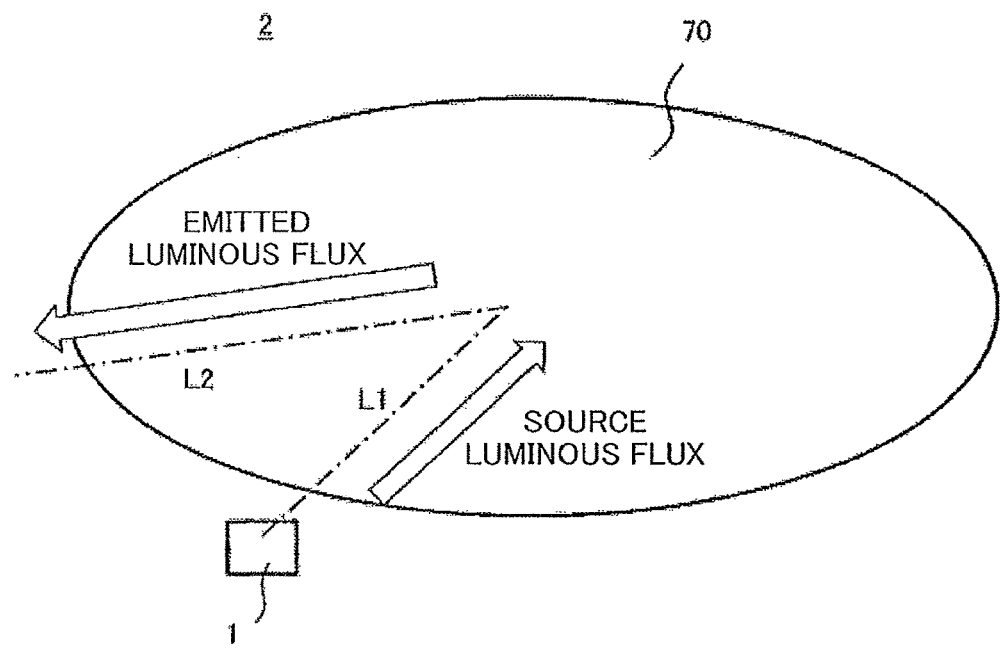
FIG. 11 is a diagram that illustrates the configuration of an automotive lighting using a solid state light source device according to a ninth embodiment.

FIG. 11 is a diagram that illustrates the configuration of an automotive lighting using a solid state light source device according to a ninth embodiment of the present invention.

The automotive lighting 2 is configured to acquire desired light distribution characteristics by reflecting luminous fluxes emitted from the solid state light source device 1 by using a reflector 70.

The light source luminous fluxes emitted from the solid state light source device 1 are incident to the reflector 70 from an obliquely forward direction (optical axis L1), are reflected by the reflector 70, and exit to the front side as emission luminous fluxes (optical axis L2). Accordingly, the shape of the reflection surface of the reflector 70 may be a spherical face that is symmetrical with respect to the optical axes L1 and L2 or a free curved shape that can be designed more freely than the aspherical shape.

In a case where the solid state light source device 1 emits light and a vehicle does not travel, the temperature of the reflector 70 is near 100° C. under warm weather. Accordingly, as the material of the reflector 70, a thermosetting resin having high heat resistance may be used. Alternatively, a thermoplastic resin having superior transferability from a mold having the shape of a reflection surface of the reflector 70 may be used.

In a conventional automotive lighting, since there is a single light emission point of a used light source, the light distribution characteristics depend only on the shape of a reflector, and the chromaticity of the reflection light (emitted light) is determined as the emission color of the single light source. In contrast to this, in the automotive lighting according to this embodiment, a plurality of solid state light source cells that are light emission points are present, and relative positions (incidence positions) between the solid state light source cells and the reflector 70 are different from each other. Accordingly, the degree of freedom for controlling the light distribution characteristics markedly increases. In addition, since the light source color is formed by combining the solid state light source cells including light's three primary colors of green, red, and blue, a desired distributed light color distribution is acquired, and an effect not present in the conventional technology can be acquired.

Meanwhile, by disposing the polarization conversion element 30 on the exit side of the solid state light source device 1, the polarization directions of exiting light are aligned, and the reflectance on the reflection surface of the reflector 70 is increased, whereby the intensity of the emitted light can be improved.

Figure 18:
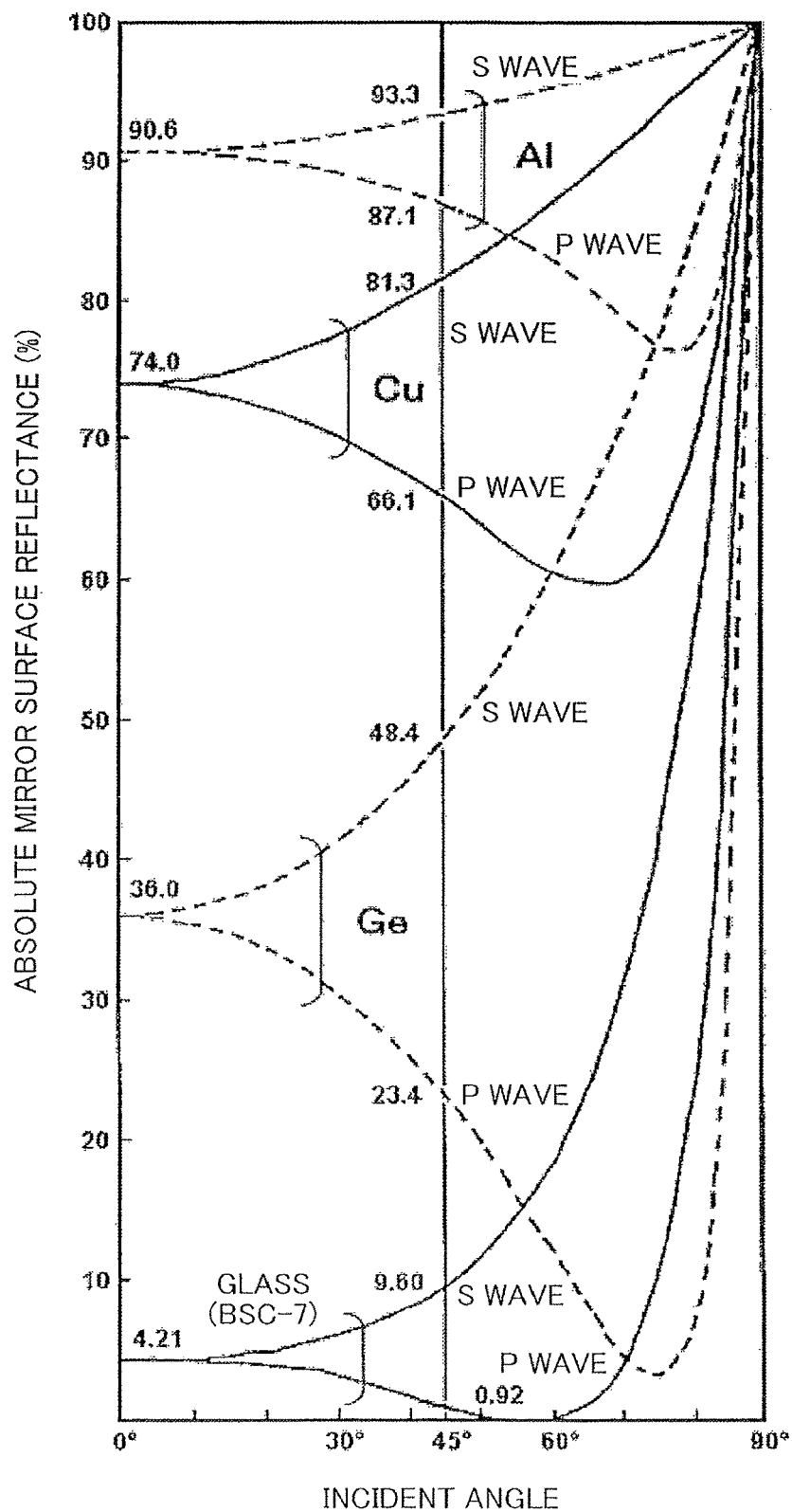
FIG. 18 is a characteristic diagram that illustrates the reflectance of each material with respect to an incidence angle.

FIG. 18 is a characteristic diagram that illustrates the reflectance of each material with respect to an incidence angle. The reflectance of a metal reflection surface has dependency on an incidence angle based on the polarization direction (an S wave or a P wave). As illustrated in FIG. 18, in terms of materials, aluminum (Al) has high reflectance, and S polarization has reflectance higher than P polarization as the polarization direction. Accordingly, by using an Al film as the reflection film of the reflector 70 and aligning the polarization directions to the S polarization, the number of luminous fluxes reflected from the automotive lighting 2 increases, and an automotive lighting having high power consumption efficiency can be realized.

In addition, as can be understood from FIG. 18, metal such as copper (Cu) or glass (BSC-7) has high reflectance for the S polarization. This means that light reflected from the body (a metal face or front glass) of a vehicle coming in the opposite direction is strong, and illumination light having superior visibility can be acquired also at the luminous flux amount according to laws and regulations.

In addition, as a driver driving the vehicle wears polarization sunglasses transmitting the polarized light described above, a secondary effect of acquiring a good field of view according to a lighting (headlight) disposed on his front side while reducing a vision disturbance according to the headlight of a vehicle coming in the opposite direction can be acquired.

Tenth Embodiment

Figure 12:
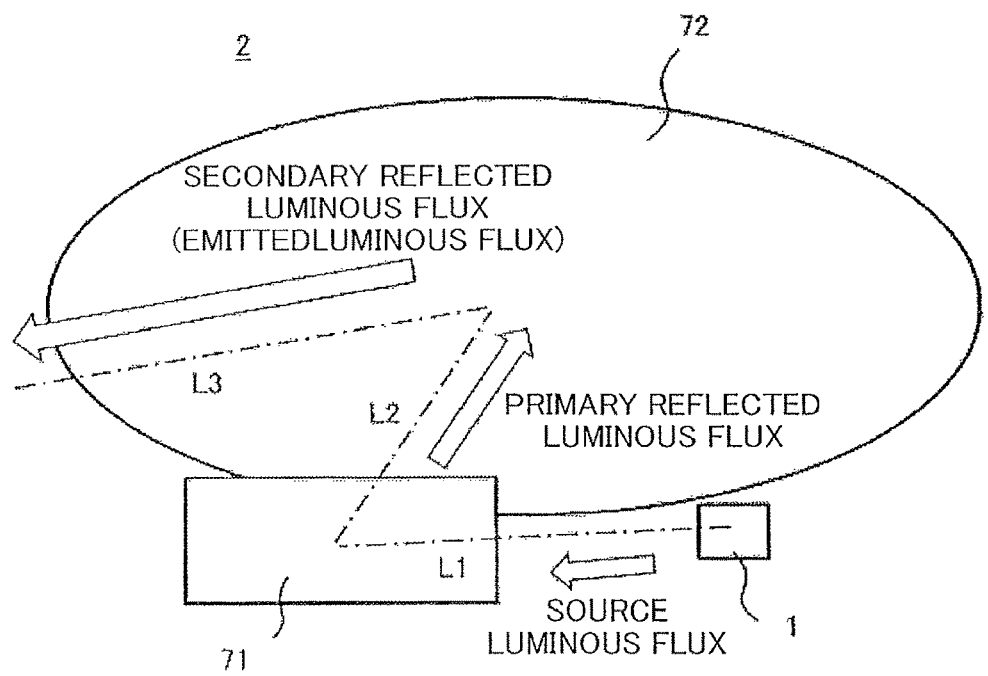
FIG. 12 is a diagram that illustrates the configuration of an automotive lighting using a solid state light source device according to a tenth embodiment.

FIG. 12 is a diagram that illustrates the configuration of an automotive lighting using a solid state light source device according to a tenth embodiment of the present invention. The automotive lighting 2 according to this embodiment is configured to reflect and emit luminous fluxes emitted from a solid state light source device 1 by using two reflectors 71 and 72.

The light source luminous fluxes emitted from the solid state light source device 1 are formed as primary reflection luminous fluxes having a desired luminous flux distribution by using the shape of the reflection surface of the first reflector 71 and then are reflected by the second reflector 72 to be secondary reflection luminous fluxes (emitted luminous fluxes). According to this configuration, since two surfaces of the reflection face can be used, the degree of freedom of design is higher than that according to the ninth embodiment (FIG. 11), the light distribution characteristics can be finely controlled, and excellent characteristics are acquired.

Also in this case, the primary reflection luminous fluxes from the first reflector 71 are incident to the second reflector 72 from an obliquely forward direction (optical axis L2), are reflected by the second reflector 72, and exit to the front side as emission luminous fluxes (optical axis L3). Accordingly, as the shape of the reflection surface of the second reflector 72, a free curved shape having a high degree of freedom of design may be selected. In addition, in this embodiment, the solid state light source device 1 can be arranged in the sheet depth length direction of the second reflector 72, and accordingly, the degree of freedom of design of the whole shape of the automotive lighting 2 is further increased.

Eleventh Embodiment

Figure 13:
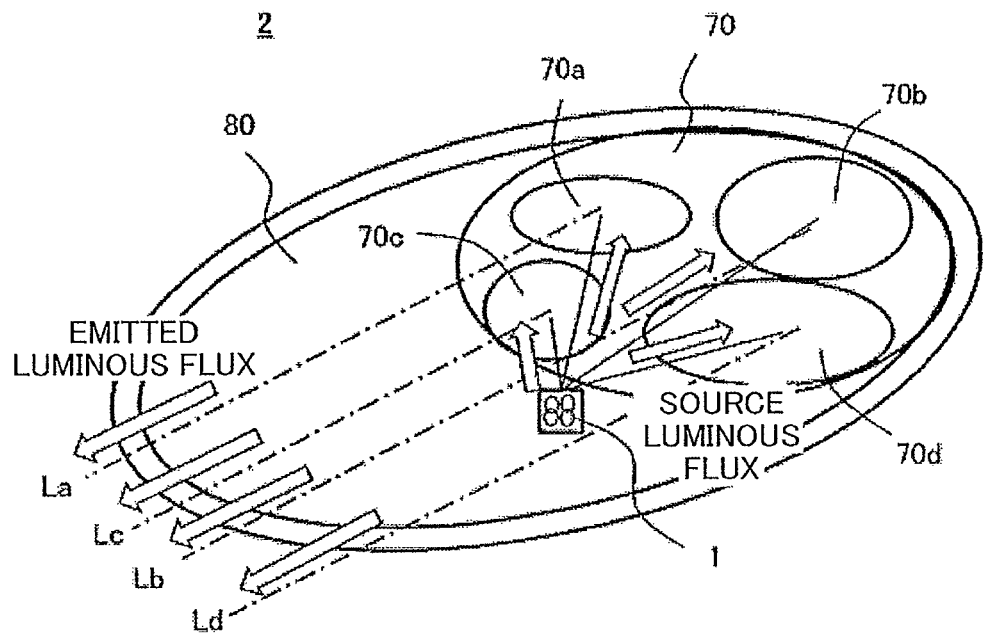
FIG. 13 is a diagram that illustrates the configuration of an automotive lighting using a solid state light source device according to an eleventh embodiment.

FIG. 13 is a diagram that illustrates the configuration of an automotive lighting using a solid state light source device according to an eleventh embodiment of the present invention. According to the automotive lighting 2 of this embodiment, in the automotive lighting 2 according to the ninth embodiment (FIG. 11), the reflection surface of the reflector 70 is formed using a composite body including a plurality of reflection surfaces. The plurality of reflection surfaces are in correspondence with a plurality of luminous fluxes emitted from the solid state light source device 1.

A plurality of luminous fluxes (denoted by arrows in the drawing) emitted from the solid state light source device 1 are respectively incident to corresponding reflection surfaces 70a to 70d of the reflector 70. Alternatively, a luminous flux emitted from one solid state light source cell may be incident to a plurality of reflection surfaces. A plurality of emission luminous fluxes (represented by optical axes La to Ld) reflected by the reflection surfaces 70a to 70d are emitted to the front side. Accordingly, illumination light having desired light distribution characteristics can be acquired.

While the emission directions (the optical axes La to Ld) from the reflection surfaces 70a to 70d may be set to a constant direction, there are also cases where the emission directions are set to mutually-different directions so as to acquire specific light distribution characteristics (light distribution). Particularly, on the reflection surfaces 70c and 70d disposed at positions close to the solid state light source device 1, the range in which luminous fluxes emitted from the solid state light source device 1 is narrow, and the light intensity per unit area is high. Accordingly, such reflection surfaces are appropriate for increasing the width of the emission luminous fluxes for easy rough control of the light distribution characteristics. In addition, by setting the optical axes Lc and Ld of the reflection light to mutually-different directions, desired light distribution characteristics can be acquired. For example, by forming a light distribution for setting the optical axis Ld toward the outer side of the vehicle by using the reflection surface 70d positioned on the outer side of the vehicle, the obliquely forward side of the vehicle can be efficiently irradiated.

On the other hand, on the reflection surfaces 70a and 70b disposed at positions far from the solid state light source device 1, the range in which luminous fluxes emitted from the solid state light source device 1 is wide, and the light intensity per unit area is low. Accordingly, fine control of the light distribution characteristics can be easily controlled, and such reflection surfaces are appropriate for distributing light at a spot by narrowing the width of the luminous fluxes. In addition, by setting the optical axes La and Lb of the reflection light to mutually-different directions, desired light distribution characteristics can be acquired.

Furthermore, in this embodiment, in order to protect the solid state light source device 1 and the reflector 70 from external atmosphere, a lighting cover 80 is arranged so as to cover the reflection surfaces. While the shape of the lighting cover 80 may be a plastic shape having a uniform thickness, the lighting cover may be configured to have a lens function so as to further control the light distribution characteristics formed by the reflector 70.

Twelfth Embodiment

Figure 14:
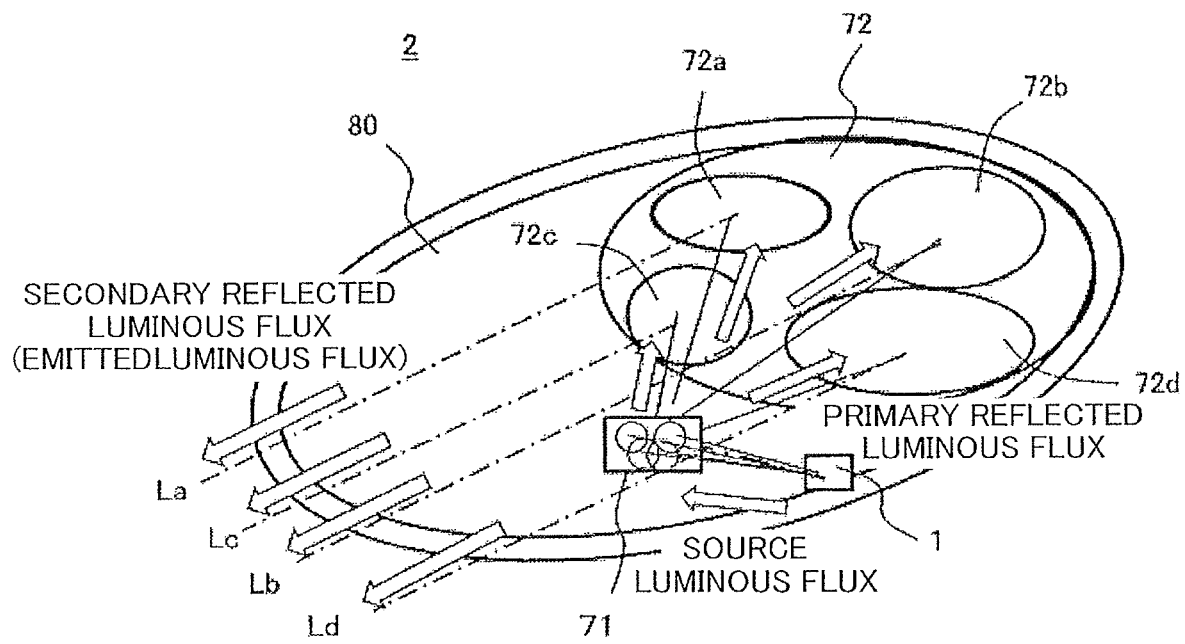
FIG. 14 is a diagram that illustrates the configuration of an automotive lighting using a solid state light source device according to a twelfth embodiment.

FIG. 14 is a diagram that illustrates the configuration of an automotive lighting using a solid state light source device according to a twelfth embodiment of the present invention. According to the automotive lighting 2 of this embodiment, in the automotive lighting 2 according to the tenth embodiment (FIG. 12), the reflection surface of a second reflector 72 is formed as a composite body including a plurality of reflection surfaces. The plurality of reflection surfaces are in correspondence with a plurality of luminous fluxes reflected from a first reflector 71.

After luminous fluxes emitted from the solid state light source device 1 are formed as primary reflection luminous fluxes having a desired luminous flux distribution based on the shape of the reflection faces of the first reflector 71, the luminous fluxes are reflected by the second reflector 72 so as to be secondary reflection luminous fluxes (emission luminous fluxes). According to this configuration, the degree of freedom of design is increased for one surface, and accordingly, the light distribution characteristics can be controlled more finely than those of the eleventh embodiment (FIG. 13), and excellent characteristics can be acquired.

The shape of the reflection surfaces of the second reflector 72, similar to that of the eleventh embodiment (FIG. 13), includes a plurality of reflection surfaces 72a to 72d. In this case, the shape is formed as a free curved shape continuously connecting the independent reflection surfaces 72a to 72d to which light split into a plurality of pieces of light is incident, and the reflection surfaces are arranged such that optical axes La to Ld representing the reflection directions of the reflection surfaces face different directions in the plurality of the reflection surfaces. Accordingly, the emission directions of the plurality of the emission luminous fluxes are changed, and desired light distribution characteristics can be realized.

Since this embodiment has a configuration acquired by combining the tenth embodiment (FIG. 12) and the eleventh embodiment (FIG. 13), it is apparent that there are advantages of both the embodiments described above.

Thirteenth Embodiment

Figure 15:
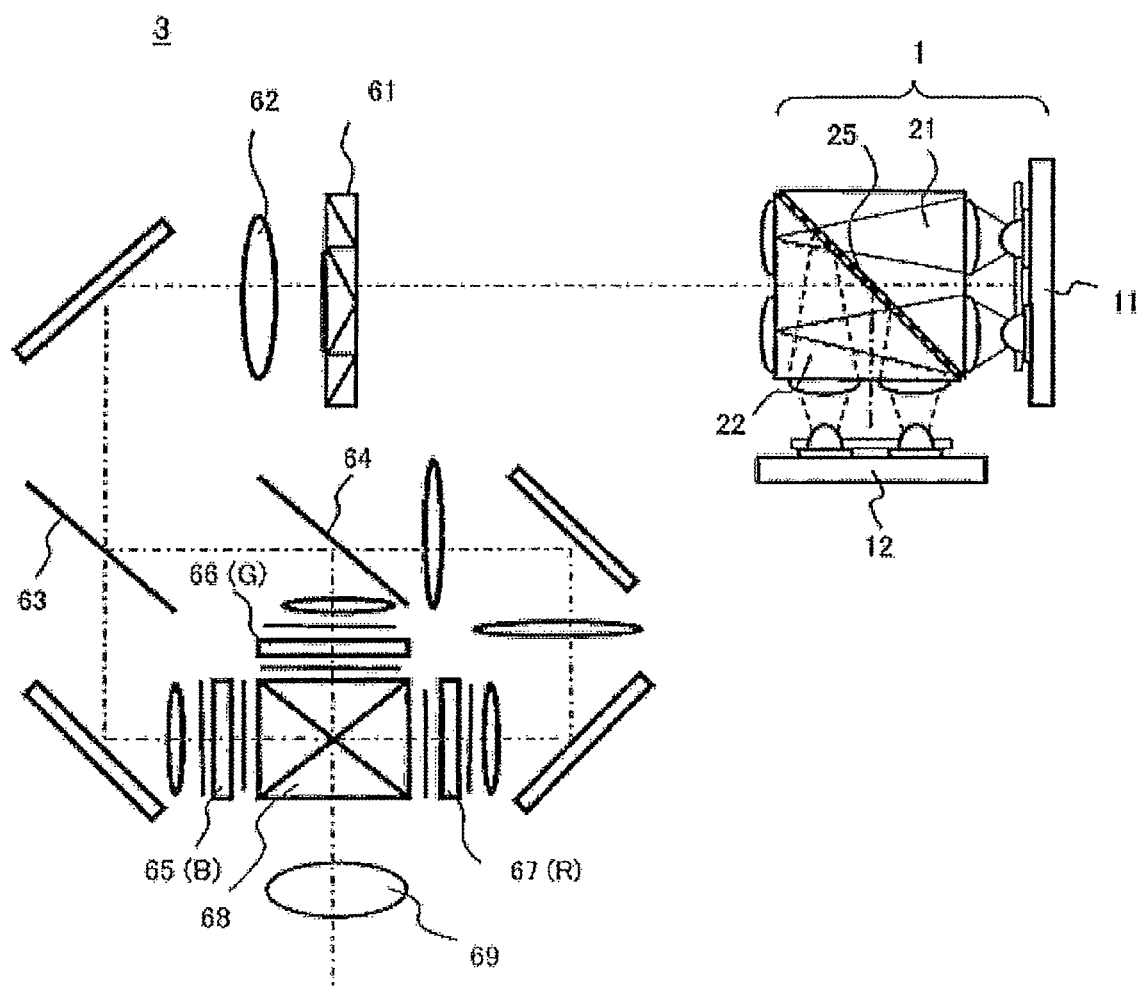
FIG. 15 is a plan view that illustrates an image display device, to which a solid state light source device is applied, according to a thirteenth embodiment.

FIG. 15 is a plan view that illustrates an image display device, to which a solid state light source device is applied, according to a thirteenth embodiment of the present invention. Here, the diagram is a plan view that illustrates the configuration of a liquid crystal-type projection device as an example. In the liquid crystal-type projection apparatus 3 illustrated here, illumination light generated by the solid state light source device 1 is guided to dichroic mirrors 63 and 64 through a polarization conversion element 61 and a weight lens 62. The dichroic mirrors 63 and 64 split the illumination light into blue green and red and emit the split illumination light to three liquid crystal panels 65, 66, and 67 that are image display elements. The image light of blue, the image light of yellow, and the image light of red are composed by a cross prism 68 and is projected from a projection lens 69 in an enlarged scale. As the image display elements, a reflection-type liquid crystal panel may be used. According to this embodiment, the emission efficiency of the light source is high, and accordingly, an image display device having high performance is realized.

In addition, as another use form of the solid state light source including a high-efficiency polarization conversion element inside the optical system, the solid state light source may be used as a light source used for a head up display (HUD) that has recently attracted attention as an image display device used for a vehicle. In such a case, the image light has reflectance that is markedly different in an image display unit such as a combiner or front glass based on the direction of polarization, and accordingly, image display that has a high contrast ratio and is clear can be performed, whereby a display having superior visibility can be realized.

Fourteenth Embodiment

In a fourteenth embodiment, a preferable drive method for a solid state light source device will be described. Here, as visual characteristics of human eyes for a light source, (1) Relation between lighting time and brightness feeling and (2) Relation between lighting frequency and flicker are reviewed, and a pulse drive method not causing flicker while reducing a drive current is proposed. As the visual characteristics of human eyes, it is known that a feeling of relative brightness of light emitted from a bright light source is different according to the length of the lighting time. In addition, it is known that a flicker feeling felt by a human changes according to a lighting frequency (blink period).

Figure 19:
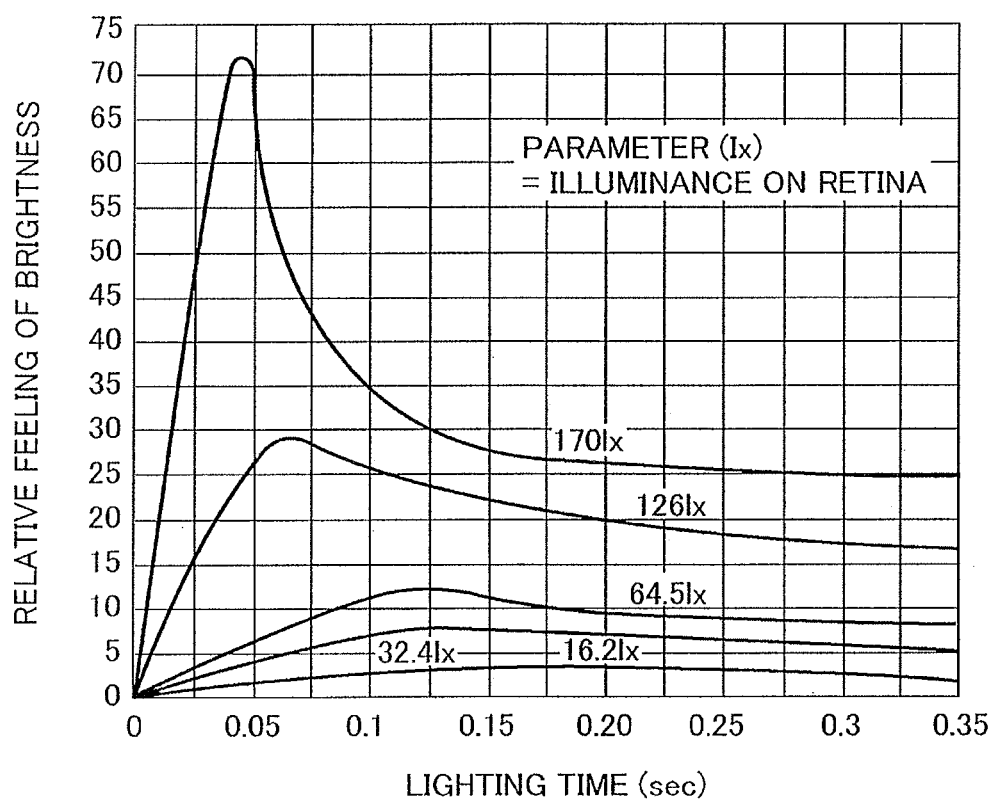
FIG. 19 is a diagram that illustrates a relation between a lighting time and a feeling of brightness felt by a human.

FIG. 19 is a diagram that illustrates a relation between a lighting time and a feeling of brightness felt by a human. As a parameter, the illuminance value on the retina is changed. For the same illuminance, in a case where the lighting time is changed, a brightness feeling felt by a human becomes different. For example, a lighting time at which illumination light having illuminance of 170 lux is seen to be the brightest is 0.05 seconds. In addition, as the illuminance increases, illumination light having a shorter lighting time is felt to be bright. For illumination light of an image display device or an automotive lighting, a case where the lighting time is 0.05 seconds or less is seen to be bright.

FIG. 20 is a diagram that illustrates a relation between a lighting frequency and a feeling of flicker felt by a human. As a parameter, the brightness (trolands) on the retina is changed. When the lighting frequency f is in the range of 5 to 20 Hz, the flicker is large, and when the lighting frequency is 60 Hz or more, the flicker almost disappears. This tendency does not depend on the brightness level Based on the findings described above, in a case where the blink frequency of a light source is 60 Hz or more, a feeling of brightness is acquired without feeling flicker. By driving the solid state light source device under such a condition, drive can be performed for which a visually brightness feeling is acquired while suppressing an average current. In other words, by switching the drive current of the LED from a DC current to a pulse (switching between levels Hi and Low), a drive method, for which a visually brightness feeling is acquired with the average current suppressed, was considered to be present, and such a method was tested.

Figure 21A:
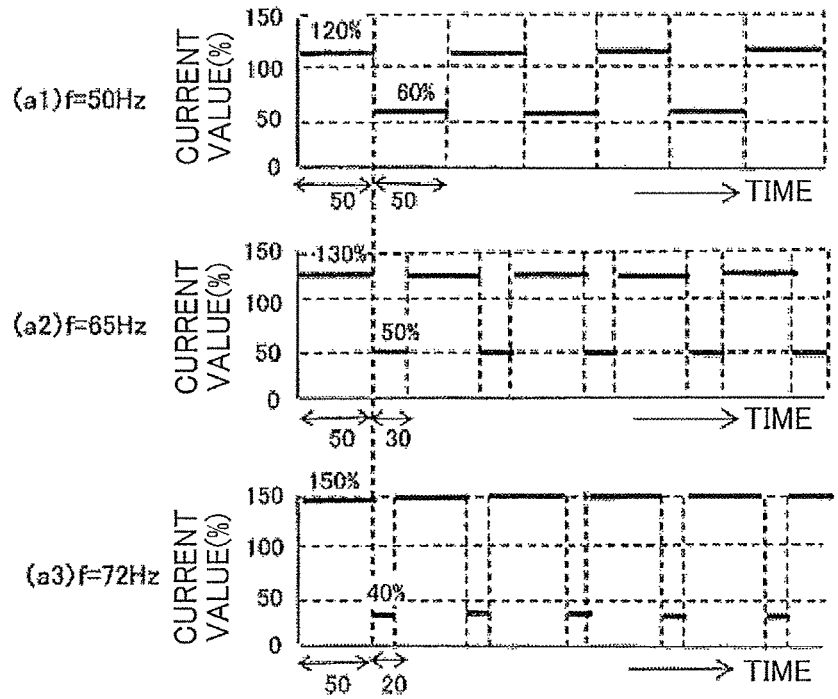
FIGS. 21A and 21B are diagrams that illustrate a result of a visual evaluation of pulse drive.
Figure 21B:
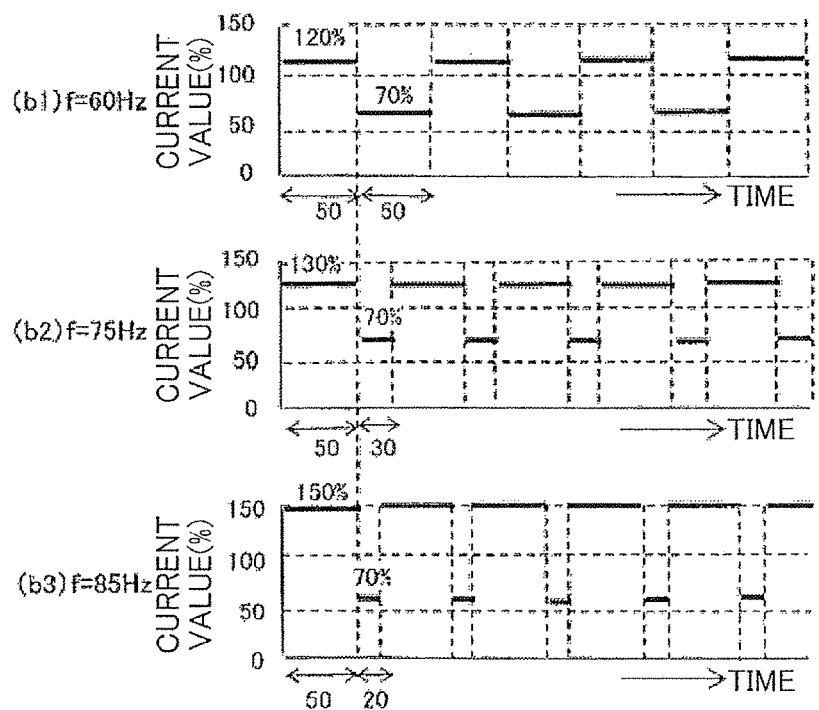

FIGS. 21A and 21B are diagrams that illustrate a result of a visual evaluation of pulse drive. Here, in a case where a pulse is used for the drive as a drive current flowing through the solid state light source, conditions in which there is no visual difference from that of a case of DC drive, in other words, several cases where same brightness is felt without feeling flicker are illustrated. As parameters, in cases where the emission color is blue having low relative visibility (FIG. 21A, a1 to a3) and cases where the emission color is green or red (FIG. 21B, b1 to b3), the blink frequency f, a current ratio between levels Hi/Low, and a time ratio (duty) between levels Hi/Low are changed. In addition, a current value at the time of DC drive is set to 100%.

(a1) In a case where the emission color is blue, the drive frequency f=50 Hz, a current ratio of Hi:Low=120%:60%, and a time ratio of Hi:Low=50:50, no flicker feeling was acquired, and a brightness feeling that is equal to that at the time of DC drive was acquired.

(a2) In a case where the drive frequency f=65 Hz, a current ratio of Hi:Low=130%:50%, and a time ratio of Hi:Low=50:30, the same evaluation result as that described above was acquired.

(a3) In a case where the drive frequency f=72 Hz, a current ratio of Hi:Low=150%:40%, and a time ratio of Hi:Low=50:20, a similar evaluation result was acquired.

(b1) In a case where the emission color is green, the drive frequency f=60 Hz, a current ratio of Hi:Low=120%:70%, and a time ratio of Hi:Low=50:50, no flicker feeling was acquired, and a brightness feeling that is equal to that at the time of DC drive was acquired.

(b2) In a case where the drive frequency f=75 Hz, a current ratio of Hi:Low=130%:70%, and a time ratio of Hi:Low=50:30, a similar evaluation result was acquired.

(b3) In a case where the drive frequency f=85 Hz, a current ratio of Hi:Low=150%:70%, and a time ratio of Hi:Low=50:20, a similar evaluation result was acquired.

For (b1) to (b3), also in a case where the emission color is red, almost the same result was acquired.

It is estimated that the reason for the results described above is that, when light emission is performed using a current of Hi at the time of pulse drive, almost constant brightness is visually felt to be continued based on the persistence characteristic of the eyes (in other words, no flicker is felt). Accordingly, compared to a case where the solid state light source is driven using a DC current, the current efficiency can be improved. In the example described above, the improvement factor of the current efficiency was about 10% in (a1), 27% in (a2), 21% in (a3), about 5% in (b1), 24% in (b2), and 18% in (b3).

As preferable conditions for the pulse drive, in a case where the drive frequency is 60 Hz or more, and the current ratio between Hi:Low is 60:40 or more, also when the time ratio between Hi and Low is 50:50, brightness can be visually felt without feeling flicker.

REFERENCE SIGNS LIST

1 Solid state light source device
2 Automotive lighting
3 Image display device
11, 12, 13 Solid state light source assembly
111 to 114, 121 to 124, and 131 to 134 Solid state light source cell
21, 22, 23, 24 Multiple lens block
211 to 214, 221 to 224, and 241 to 244 Multiple lens cell
25, 26 Dichroic filter
30 Polarization conversion element
41, 42 Light shielding plate
50 Superposition lens
55 Luminous flux conversion mirror
65 to 67 Liquid crystal panel
69 Projection lens
70 to 72 Reflector
80 Lighting cover
90 Light receiving unit

The invention claimed is:

1. An automotive lighting using a solid state light source device, the automotive lighting comprising:
a reflector that reflects light exiting from the solid state light source device,
wherein the solid state light source device includes a solid state light source assembly in which a plurality of solid state light source cells that are light emitting points are arranged in a matrix pattern,
wherein the solid state light source cells are formed by combining solid state light source cells having light emission colors including light's three primary colors,
wherein light exiting from a plurality of the solid state light source cells is incident to different positions in the reflector,
wherein a polarization conversion element is arranged between the solid state light source device and the reflector, and
wherein the polarization conversion element includes a polarized beam splitter film that transmits P-polarized light and reflects S-polarized light and a phase difference plate that converts the transmitted P-polarized light into S-polarized light.

2. An automotive lighting using a solid state light source device using solid state light sources as light emitting bodies, comprising:
the solid state light source device comprising:
N (here, N is an integer of two or more) sets of solid state light source assemblies in which a plurality of solid state light source cells are arranged in a matrix pattern;
a multiple lens block that includes N incidence faces facing the N sets of solid state light source assemblies and causing light emitted from the solid state light source cells to be incident through multiple lens cells of a matrix pattern and one emission face composing the light incident from the N incidence faces and causing composed light to exit through multiple lens cells of a matrix pattern; and
a dichroic filter that is obliquely arranged on the incidence faces inside the multiple lens block and selectively reflects or transmits incident light based on a wavelength of the incident light,
wherein light distribution characteristics and a color temperature of light exiting from the emission face of the multiple lens block to a light receiving unit are controlled by controlling a ratio of power supplied to the solid state light source cells; and
the automotive lighting comprising:
a reflector that reflects light exiting from the multiple lens block as the light receiving unit,
wherein light exiting from a plurality of the multiple lens cells disposed in the multiple lens block is incident to different positions in the reflector.

3. The automotive lighting according to claim 2,
wherein the solid state light source device is arranged in an inclining direction with respect to the reflector, and
wherein a shape of each reflection surface of the reflector is an aspherical shape acquired by decentering the reflection surface with respect to an optical axis representing a beam reflection direction of the reflection surface or a free curved shape.

4. An automotive lighting using a solid state light source device using solid state light sources as light emitting bodies, comprising:
the solid state light source device comprising:
N (here, N is an integer of two or more) sets of solid state light source assemblies in which a plurality of solid state light source cells are arranged in a matrix pattern;
a multiple lens block that includes N incidence faces facing the N sets of solid state light source assemblies and causing light emitted from the solid state light source cells to be incident through multiple lens cells of a matrix pattern and one emission face composing the light incident from the N incidence faces and causing composed light to exit through multiple lens cells of a matrix pattern; and
a dichroic filter that is obliquely arranged on the incidence faces inside the multiple lens block and selectively reflects or transmits incident light based on a wavelength of the incident light,
wherein light distribution characteristics and a color temperature of light exiting from the emission face of the multiple lens block to a light receiving unit are controlled by controlling a ratio of power supplied to the solid state light source cells; and
the automotive lighting comprising:
a first reflector that reflects light exiting from the multiple lens block as the light receiving unit; and
a second reflector that further reflects reflection light split from the first reflector,
wherein a reflection surface of the second reflector has a free curved surface shape continuously connecting independent reflection surfaces to which light split into a plurality of pieces of light is incident and is arranged such that optical axes representing emission directions of the reflection surfaces face different directions on a plurality of the reflection surfaces.

* * * * *